(12) United States Patent
Lin (10) Patent No.: US 12,129,541 B2
(45) Date of Patent: Oct. 29, 2024

(54) DEPOSITION METHOD FOR TUNING MAGNETIC FIELD DISTRIBUTION OF DEPOSITION EQUIPMENT

(71) Applicant: SKY TECH INC., Hsinchu County (TW)

(72) Inventor: Jing-Cheng Lin, Hsinchu County (TW)

(73) Assignee: SKY TECH INC., Hsinchu County (TW)

( * ) Notice: Subject to any disclaimer, the term of this patent is extended or adjusted under 35 U.S.C. 154(b) by 0 days.

(21) Appl. No.: 18/072,483

(22) Filed: Nov. 30, 2022

(65) Prior Publication Data

US 2023/0091273 A1   Mar. 23, 2023

Related U.S. Application Data

(62) Division of application No. 17/488,126, filed on Sep. 28, 2021, now abandoned.

(30) Foreign Application Priority Data

May 28, 2021 (TW) .................................. 110119555

(51) Int. Cl.
   *C23C 14/54*   (2006.01)
   *C23C 14/34*   (2006.01)
   *C23C 14/35*   (2006.01)
   *H01J 37/34*   (2006.01)

(52) U.S. Cl.
   CPC ........ *C23C 14/545* (2013.01); *C23C 14/3492* (2013.01); *C23C 14/35* (2013.01); *C23C 14/542* (2013.01); *H01J 37/3435* (2013.01); *H01J 37/345* (2013.01); *H01J 37/3461* (2013.01); *H01J 37/347* (2013.01); *H01J 37/3476* (2013.01)

(58) Field of Classification Search
   CPC ..... C23C 14/35; C23C 14/545; C23C 14/542; C23C 14/546; C23C 14/547; H01J 37/3461; H01J 37/3435; H01J 37/345; H01J 37/347; H01J 37/3476
   See application file for complete search history.

(56) References Cited

FOREIGN PATENT DOCUMENTS

CN          111593308 A  *  8/2020  ............. C23C 14/35

OTHER PUBLICATIONS

Machine Translation CN 111593308 (Year: 2020).*

* cited by examiner

*Primary Examiner* — Michael A Band
(74) *Attorney, Agent, or Firm* — Chun-Ming Shih; HDLS IPR SERVICES (57) ABSTRACT

The present disclosure provides a deposition equipment, which includes a reaction chamber, a carrier, a target material, a magnetic device are at least one shield unit. The carrier and the target material are disposed within the containing space, wherein the carrier is for carrying a substrate, also a surface of the target material faces the carrier and the substrate. The magnetic device is disposed on another surface of the target material, to generate a magnetic field within the containing space through the target material. The shield unit is made electrical conductor and is disposed between a portion of the magnetic device and a portion of the target material, wherein the shield unit is for partially blocking and micro-adjusting the magnetic field generated by the magnetic device within the containing space, such that to improve an evenness of thickness for a thin film formed on the substrate.

4 Claims, 13 Drawing Sheets

DEPOSITION METHOD FOR TUNING MAGNETIC FIELD DISTRIBUTION OF DEPOSITION EQUIPMENT

CROSS-REFERENCE TO RELATED APPLICATIONS

This application is a Divisional patent application of co-pending application Ser. No. 17/488,126 filed Sep. 28, 2021.

TECHNICAL FIELD

The present disclosure relates to a deposition method for tuning magnetic field distribution of a deposition equipment, more particularly a deposition method capable of tuning a distribution of magnetic field to hence improve an uniformity of thin film deposited on a substrate.

BACKGROUND

Thin-film-deposition equipments, such as chemical-vapor deposition (CVD), physical-vapor deposition (PVD) and the atomic-layer deposition (ALD) equipments, those are commonly employed in manufacturing process of semiconductors, light-emitting diodes and displays, etc.

A thin-film-deposition equipment mainly includes a chamber and a substrate carrier, wherein the substrate carrier is within the chamber for carrying at least one substrate. To exemplify by PVD, a target material is required to dispose within the chamber, wherein the target material faces the substrate on the substrate carrier. When performing PVD, noble gas or reactive gas is transferred into the chamber, then bias electricity is applied on the target material and the substrate carrier respectively, also the substrate carried on by the substrate carrier is heated up.

The noble gas or reactive gas within the chamber transforms into ionized gas in effect of a high-voltage electric field and electrons, and then the ionized gas is attracted by the bias electricity to bombard the target material. Thereby, atoms or molecules splashed from the target material are attracted by the bias electricity on the substrate carrier, then be deposited on surface of the substrate and forms a thin film on the surface of the substrate.

During the process of forming the thin film, a plurality of magnets are commonly disposed above the target material in a relatively rotatable manner, such that to from a magnetic field below the target material. The electrons are then affected by the magnetic field, and hence move in a spiral direction, such that to have a greater chance to ionize the gas, for further creating more splashed from the target material, and thereby to improve a uniformity of the thin film deposited on the substrate.

SUMMARY

As described above, how to improve the uniformity of the thin film deposited on substrate in the deposition process, which is main object for the industries. Along with that, the present disclosure provides a deposition equipment, which is disposed with a shield unit between a portion of a magnetic device and a portion of the target material, for micro-adjusting, tuning a magnetic-field distribution of the magnetic field generated by the magnetic device within a containing space or a reacting space, such that to effectively improve the uniformity of the thin film deposited on substrate.

An object of the present disclosure is to provide a deposition equipment, which mainly includes a reaction chamber, a carrier, a target material, a magnetic device and at least one shield unit. The target material and the carrier are disposed within the containing space of the reaction chamber, wherein the target material has a surface facing the carrier and a substrate carried thereon. The magnetic device is disposed on another surface of the target material, to generate a magnetic field within the containing space via the target material. The shield unit is disposed between the magnetic device and the target material, for partially blocking the magnetic field of the magnetic device and hence to tune the magnetic-field distribution of the magnetic device within the containing space.

In practical use, according to a thickness of the thin film deposited in different areas on the substrate, a location or thickness of the shield unit may also be configured to tune, adjust the magnetic-field distribution of the magnetic device in different areas within the containing space, thereby to improve the uniformity of the thin film later deposited on the substrate.

An object of the present disclosure is to provide a deposition equipment, which is mainly disposed with a connector on a surface of target material facing the magnetic device and the shield unit, such that the shield unit can be fastened on the surface of the target material, for tuning the magnetic-field distribution within the containing space.

An object of the present disclosure is to provide a deposition equipment, wherein the reaction chamber includes an opening, the target material covers the opening of the reaction chamber to define a containing space between the reaction chamber and the target material.

Furthermore, an insulating seal (e.g. O-ring) is disposed between the target material and the reaction chamber, such that the target material and the reaction chamber are not electically connected to each other, for preventing a bias electricity on the target material from grounding via the reaction chamber. Moreover, the target material is disposed on a back plate, and the opening of the reaction chamber is covered by the back plate and/or the target material, such that to form a containing space.

An object of the present disclosure is to provide a deposition equipment with a magnetic-field-distribution tuner (MFD tuner), which is mainly disposed with at least one shield unit between a portion of the target material and a portion of the magnetic device, wherein the shield unit partially blocks the magnetic field generated by the magnetic device. Moreover, according to different manufacturing process, a material of the shield unit may be variable with thickness, shape or area size, in order to generate, form an evenly distributed magnetic field within the containing space.

An object of the present disclosure is to provide a deposition method proceeding with a MFD tuner, which is first to employ a deposition equipment, for performing a deposition process on a surface of a test substrate (first substrate) to form a thin film thereon. On next, to measure thicknesses of the thin film formed on different areas of the test substrate, and partition the test substrate into different thickness areas according to the thicknesses of thin film measured on the test substrate. Thereafter, in accordance with the thicknesses of the thin film on the test substrate, then to place the shield unit between the magnetic device and the target material also adjusting a location thereof corresponding to the thickness areas, such that to partially, locally adjust a magnetic field within the reaction chamber, in order to form a thin film with an evenly-distributed thickness on an actual substrate (second substrate) for a later-proceeded deposition process.

To achieve one of the abovementioned object, the present disclosure provides a deposition equipment, which includes a reaction chamber having a containing space; a carrier disposed within the containing space for carrying at least one substrate; a target material connected to the containing space of the reaction chamber, and including a first surface and a second surface, wherein the first surface and the second surface are two opposite surfaces on the target material, with the first surface facing the carrier; a magnetic device disposed on the second surface of the target material, for forming a magnetic field within the containing space; and at least one shield unit disposed between a portion of the magnetic device and a portion of the target material, and partially blocking the magnetic field generated by the magnetic device, wherein the shield unit includes an electrical conductor.

The present disclosure also provides a MFD tuner which is adapted to a deposition equipment, and which includes: a target material having a first surface and a second surface, wherein the first surface and the second surface are two opposite surfaces on the target material; a magnetic device disposed on the second surface of the target material, for forming a magnetic field on the first surface of the target material; and at least one shield unit disposed between a portion of the magnetic device and a portion of the target material, and partially blocking the magnetic field generated by the magnetic device, wherein the shield unit includes an electrical conductor.

Moreover, the present disclosure provides a deposition method, which includes: a step of placing a first substrate on a carrier; a step of performing a deposition process to the first substrate, to form a thin film on a surface of the first substrate; a step of measuring a thickness of the thin film which deposited on the first substrate; and a step of placing a shield unit between a portion of a magnetic device and a portion of the target material in accordance with thicknesses of the thin film on different areas of the first substrate, for partially blocking a magnetic field generated by the magnetic device.

Another object of the present disclosure is to provide the aforementioned deposition equipment and the MFD tuner, wherein the shield unit includes a main portion, a plurality of openings and/or cavities disposed on the main portion. The main portion of the shield unit is for blocking the magnetic field generated by the magnetic device, to weaken the magnetic field within the containing space, locally corresponding to the main portion. The openings of shield unit do not block and weaken the magnetic field of the magnetic device.

To achieve the abovementioned object, the present disclosure provides the aforementioned deposition equipment and the MFD turner, wherein the shield unit includes a main portion, a plurality of openings and/or cavities disposed on the main portion.

Another different object of the present disclosure is to provide the aforementioned deposition equipment and the MFD tuner, which is mainly disposed with at least one lock unit between the magnetic device and the target material, wherein the lock unit includes at least one mounting space. At least one shield unit is disposed within the mounting space of the lock unit, and also positioned between a portion of the magnetic device and a portion of the target material, for tuning the distribution of magnetic field within the containing space.

The lock unit is made of electrical insulator, which has no effect to the magnetic field generated by the magnetic device. In practical, the lock unit may be disposed on the surface of the target material, or may be fastened on the aforementioned mounting chamber without contacting the target material. By virtue of the lock unit, this can facilitate a process of mounting, dismounting the shield unit, or adjusting a location of the shield unit, for convenience.

To achieve the abovementioned object, the present disclosure provides the aforementioned deposition equipment and the magnetic-field-distribution tuner, which further includes a lock unit disposed between the magnetic device and the target material and having at least one mounting space. The shield unit is disposed between the mounting space of the lock unit and positioned between a portion of the magnetic device and a portion of the target material, for locally blocking the magnetic field of the magnetic device.

BRIEF DESCRIPTION OF THE DRAWINGS

The structure as well as preferred modes of use, further objects, and advantages of this present disclosure will be best understood by referring to the following detailed description of some illustrative embodiments in conjunction with the accompanying drawings, in which.

DETAILED DESCRIPTION OF THE PREFERRED EMBODIMENTS

Figure 1:
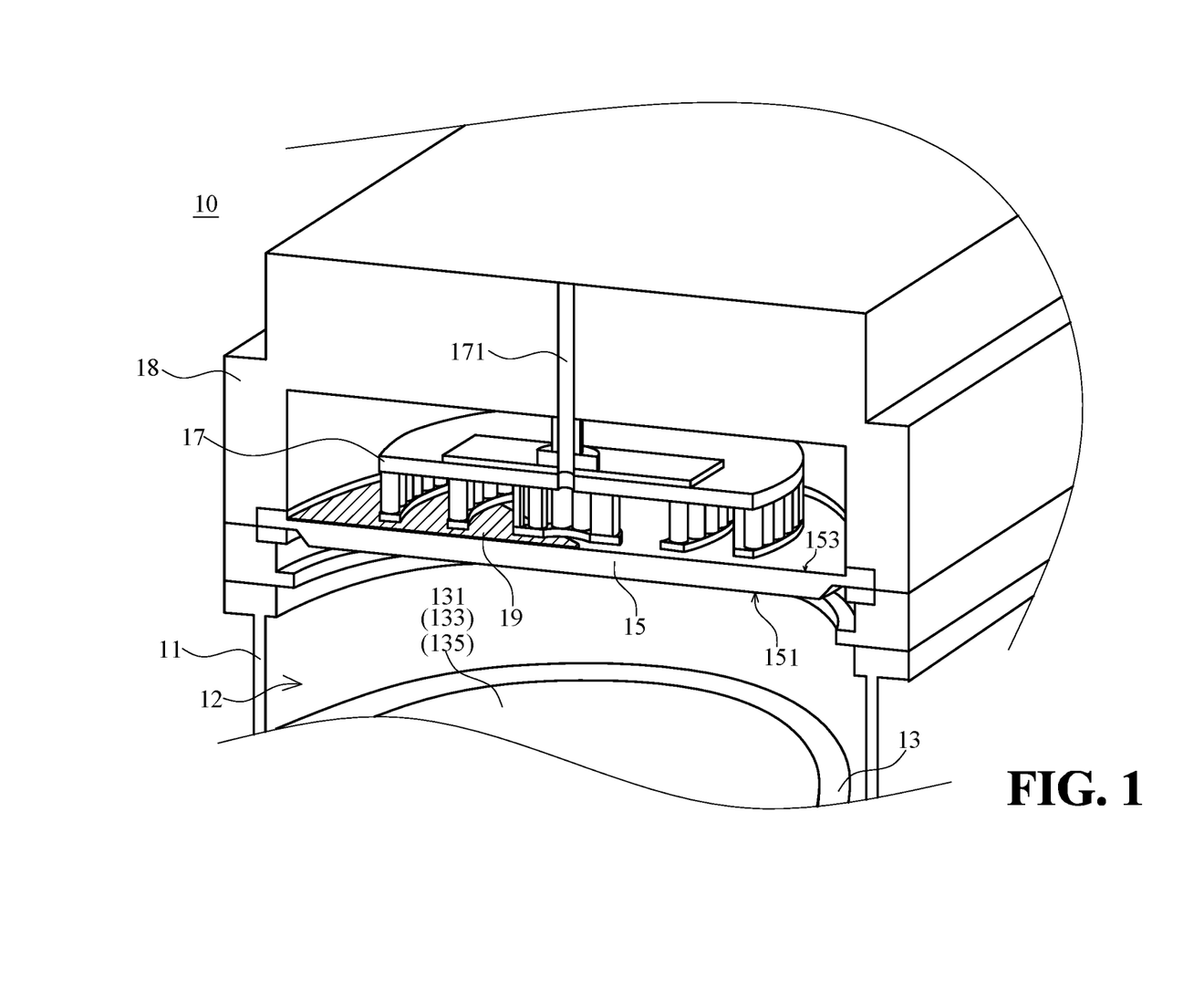
FIG. 1 is a schematic perspective sectional view illustrating a deposition equipment according to one embodiment of the present disclosure.
Figure 2:
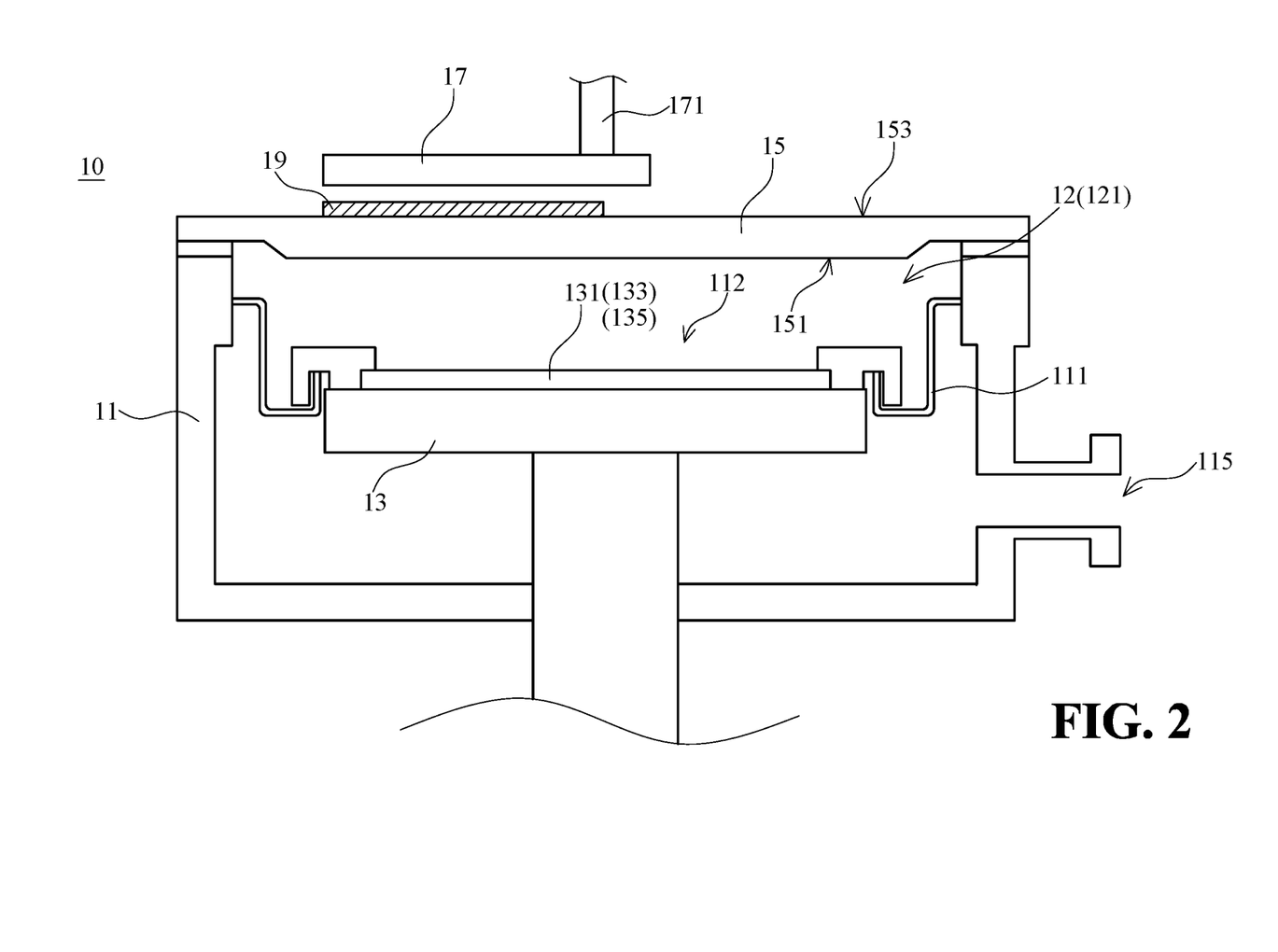
FIG. 2 is a schematic sectional view illustrating the deposition equipment according to one embodiment of the present disclosure.
Figure 3:
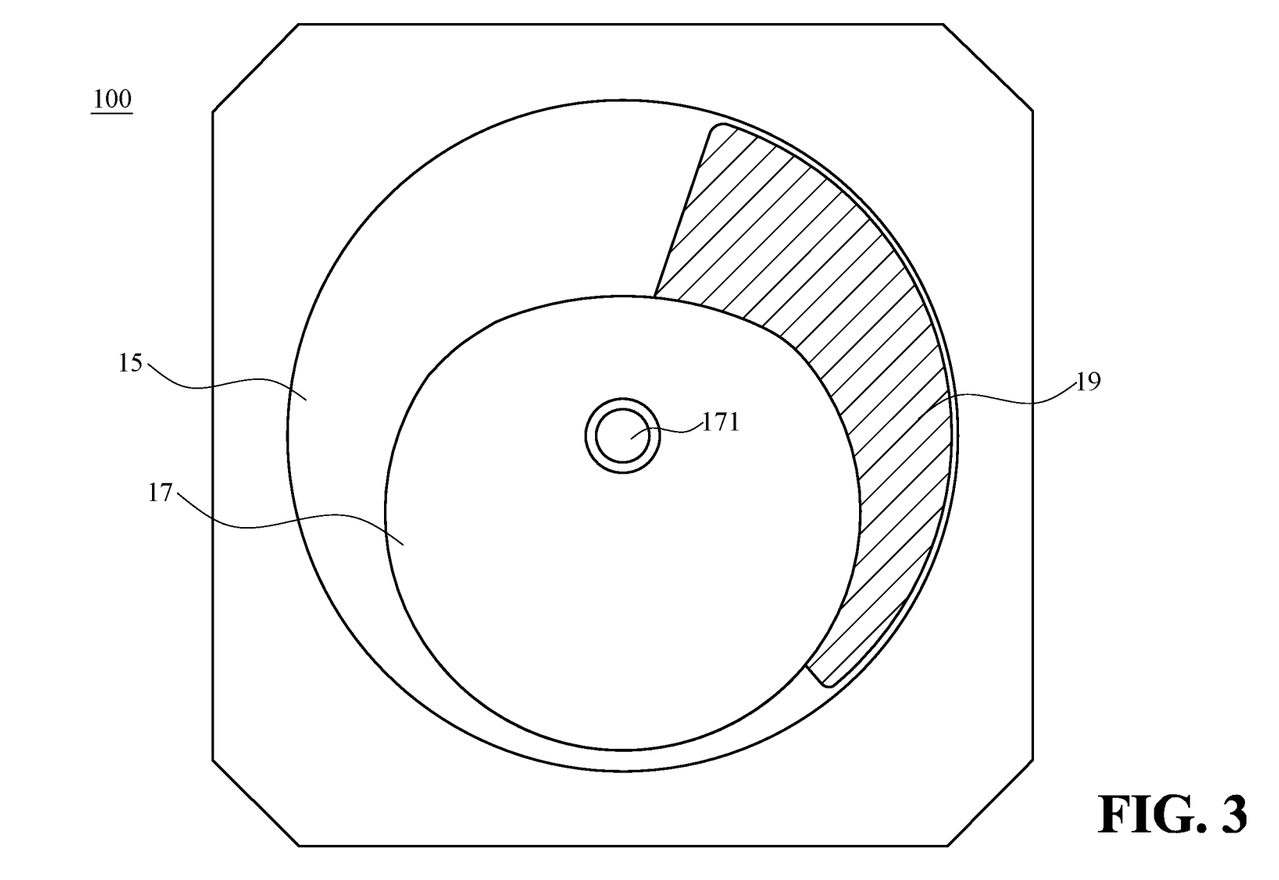
FIG. 3 is a schematic top view illustrating a magnetic-field-distribution tuner according to one embodiment of the present disclosure.

Referring to FIG. 1 and FIG. 2, which respectively are a schematic perspective sectional view illustrating a deposition equipment 10, and a schematic sectional view illustrating the deposition equipment 10, according to one embodiment of the present disclosure. As shown in FIGS., the deposition equipment 10 mainly includes a reaction chamber 11, a carrier 13, a target material 15, a magnetic device 17 and a shield unit 19. Specifically, the target material 15, the magnetic device 17 and the shield unit 19 are included into a magnetic-field-distribution tuner (hereafter, "MFD tuner") 100, as shown in FIG. 3.

The reaction chamber 11 has a containing space 12 therein, for containing the carrier 13 and the target material 15. The carrier 13 is for carrying at least one substrate 131. The target material 15 is disposed to face the carrier 13 and the substrate 131 carried thereon. In more detail, the reaction chamber 11 may be disposed with an opening which is on top of the opening of the reaction chamber 11 (similar to an upper portion of a reacting space 121 in FIG. 2), for example. The containing space 12 of the reaction chamber 11 may be spatially connected to an outside via the opening, wherein the target material 15 is disposed within or disposed to cover, shut the opening, thereby to seal the containing space 12.

The carrier 13 is movable relative to the target material 15 via such an elevating mechanism (not shown), such that to adjust a distance between the carrier 13 and the target material 15. To be specific, the carrier 13 can be driven to move away from the target material 15, then to allow a robotic arm (not shown) to transport a substrate 131 into the reaction chamber 11 and place the substrate 131 on the carrier 13, or to remove, extract the substrate 131 from the carrier 13 out of the reaction chamber 11. Alternatively, the carrier 13 may also carry the substrate 131 thereon to approach the target material 15, hence to decrease the distance between the substrate 131 thereon and the target material 15, for performing a deposition process to the substrate 131.

In one embodiment of the present disclosure, the deposition equipment 10 may be configured for physical-vapor deposition (PVD), which applies electric field within the containing space 12, to control electrons to electrify a neutral gas disposed therein into ionized gas, meanwhile to apply bias electricity on the target material 15 and the carrier 13, such that the ionized gas is attracted to bombard the target material 15 and create tiny particles splashed from the target material 15 (e.g. atoms or molecules of the target material 15), thereafter, the particles splashed from the target material 15 are then attracted by the bias electricity on the carrier 13, and hence to deposit on surface of the substrate 131 and form a thin film thereon.

The target material 15 includes two opposite surfaces as a first surface 151 and a second surface 153, wherein the first surface 151 is disposed to face the carrier 13 and/or the substrate 131 thereon. The target material 15 may be formed in a proximately round-plate shape, with the first surface 151 at bottom, and the second surface 153 on top. In order to improve a chance for ionizing the neutral gas into plasma, a magnetic device 17 may be disposed on the second surface 153 of the target material 15, generates a magnetic field at side of the first surface 151 and within the containing space 12. Thereby the electrons within the containing space 12 are led by the magnetic field to move in a spiral manner, such that to have more movement and increase the chance for ionizing the neutral gas. In addition, the magnetic device 17 may be connected to a rotary shaft 171, and driven by the rotary shaft 171 to rotate related to the target material 15, such that to adjust, tune the magnetic field and further improve a uniformity, evenness of the thin film deposited on the substrate 131.

The magnetic device 17 can improve the chance for ionizing the gas into plasma, to further improve a rate of creating the splashed particles from the target material 15 and controlling the uniformity, evenness of the deposited thin film. However, due to the magnetic device 17 is made of multiple magnets, which can only adjust the magnetic field thereof by rearranging vectors or positions of the magnets, which may be insufficient for micro-adjusting the magnetic field, and therefore unable to achieve an enough evenness of the deposited thin film on the substrate 131.

Thus, the deposition equipment 10 according to the present disclosure further includes at least one shield unit 19, which is disposed between a portion of the magnetic device 17 and a portion of the target material 15, for partially redirecting, blocking the magnetic field generated by the magnetic device 17. The shield unit 19 is made of electrical conductor, such as ferromagnetic metal.

By virtue of the shield unit 19, which can partially redirect, block the magnetic field of the magnetic device 17, to partially, locally weaken the magnetic field at side of the first surface 151 of the target material 15 and/or within the containing space 12, in order to micro-adjust, tune a distribution of the magnetic field within the containing space 12.

By micro-adjusting the distribution of the magnetic field at side of first surface 151 of the target material 15 within the containing space 12, which can hence change thicknesses of different areas of the thin film deposited on the substrate 131, to further improve a thickness-percentage difference thereof by reducing that to a value less than 1%, for example. A detailed deposition method for achieving such improvement and experimental data are described in embodiments detailed later.

In addition, as shown in FIG. 1, a mounting chamber 18 may be disposed above the reaction chamber 11, for containing and mounting the magnetic device 17 and the shield unit 19. Moreover, the second surface 153 of the target material 15 is disposed to face the mounting chamber 18.

In one embodiment of the present disclosure, a tubular blocking member 111 may be disposed within the containing space 12 of the reaction chamber 11. The blocking member 111 has one end formed with a flange to fit and connect to an inner wall of the reaction chamber 11, and another end formed with an opening 112. The carrier 13 is able to approach the target material 15 and enter or shut the opening 112, such that the reaction chamber 11, the carrier 13, the target material 15 and the blocking member 111 together define a reacting space 121 within the containing space 12 for proceeding the deposition process to the substrate 131 on the carrier 13 therein. With such structure, the shield unit 19 locally, partially micro-adjusts the magnetic field and the distribution thereof within the reacting space 121, in order to form the thin film on the substrate 131 with an evenly-distributed thickness.

In one embodiment of the present disclosure, the shield unit 19 may be directly disposed on the second surface 153 of the target material 15, and electrically connected to the target material 15, wherein the target material 15 is not electrically connected to the reaction chamber 11. In other embodiment of the present disclosure, the shield unit 19 may be connected to the target material 15 in an indirect manner, furthermore, the shield unit 19 may be electrically grounded via a grounding wire or other grounding component.

Figure 4:
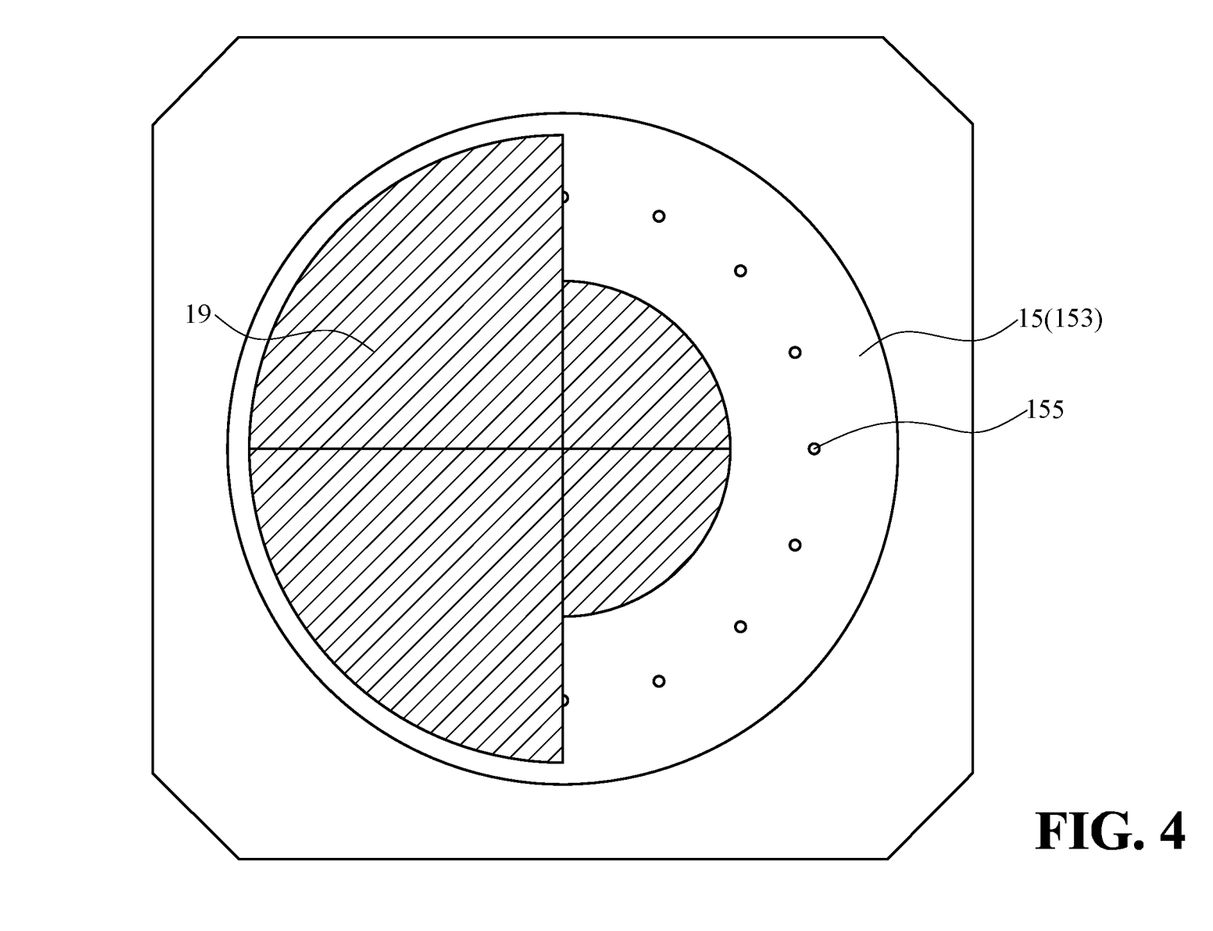
FIG. 4 is a schematic top view illustrating a target material and a shield unit of the magnetic-field-distribution tuner, according to one embodiment of the present disclosure.
Figure 5:
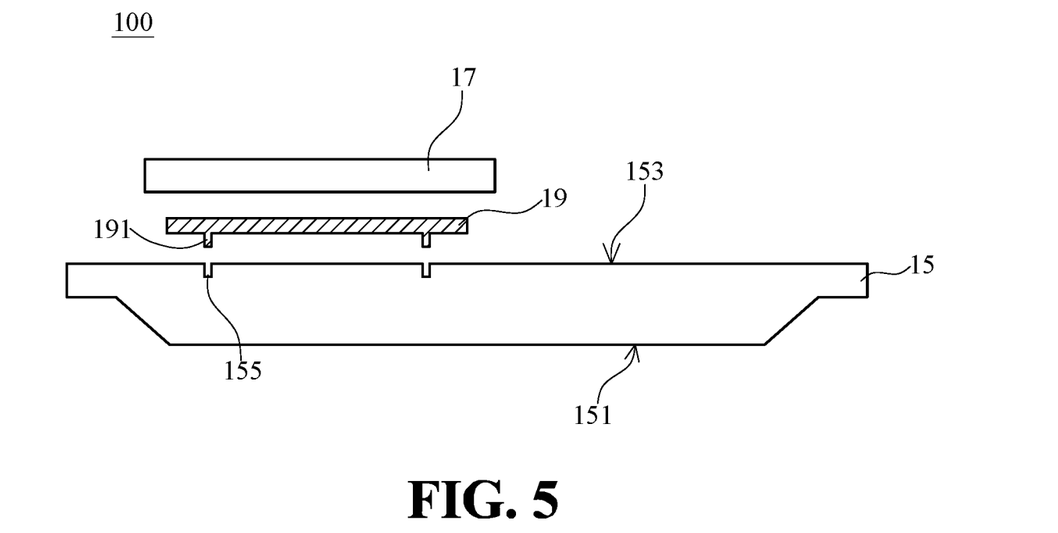
FIG. 5 is a schematic sectional view illustrating the magnetic-field-distribution tuner, according to one embodiment of the present disclosure.
Figure 6:
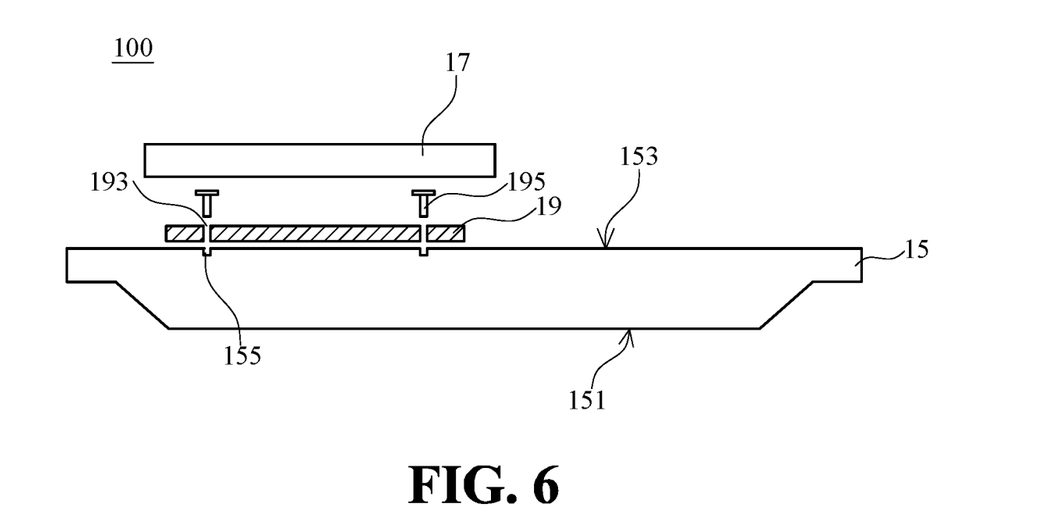
FIG. 6 is a schematic sectional view illustrating the magnetic-field-distribution tuner, according to one different embodiment of the present disclosure.

In addition, the second surface 153 of the target material 15 may be disposed with a plurality of pin holes 155, as shown in FIG. 4 and FIG. 5. The shield unit 19 may be formed with a plurality of shield pins 191, for entering the pin holes 155 on the second surface 153 of the target material 15, such that the shield unit 19 is fastened on the second surface 153 of the target material 15. In a different embodiment as shown in FIG. 6, the shield unit 19 may be formed with a plurality of through holes 193 which corresponds to the pin holes 155 of the target material 15. Furthermore, with a plurality of connectors 195 (e.g. bolts or pins, etc.) to extend through the through holes 193 of the shield unit 19 and into the pin holes 155 of the target material 15, thereby to fasten the shield unit 19 on the target material 15.

However, the two abovementioned connecting manners between the shield unit 19 and the target material 15 should not limit claim scope of the present disclosure, in practical use, any other fastening manner are applicable for connecting the shield unit 19 and the target material 15 (e.g. bolt fastening, etc.). Moreover, the shield unit 19 can be plural disposed at side of the second surface 153 of the target material 15, with any possible manner of arrangement. Also, the shield unit 19 may be formed with different shapes or area sizes, for creating different blocking effects against the magnetic field.

Figure 7:
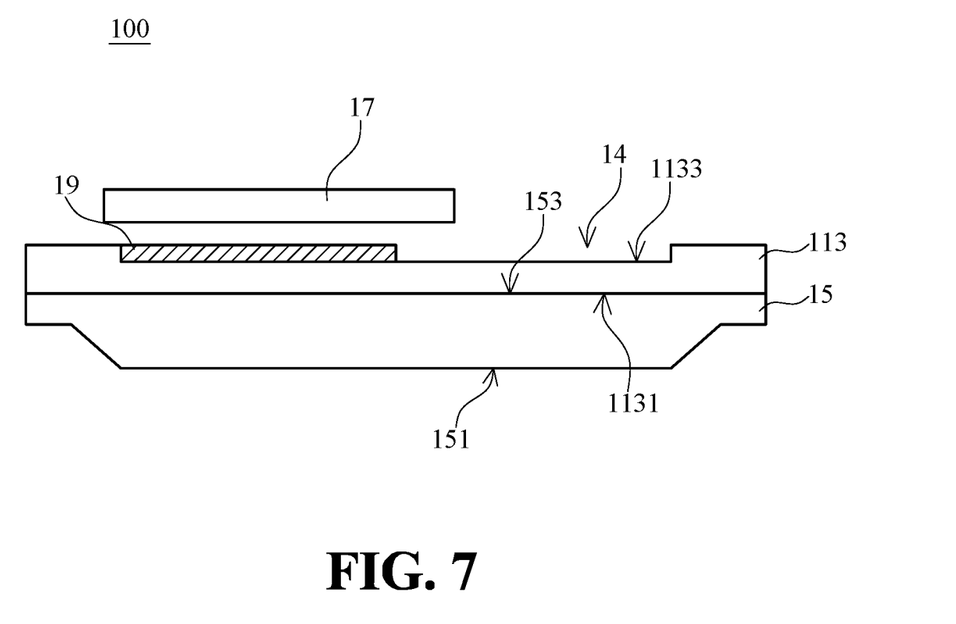
FIG. 7 is a schematic sectional view illustrating the magnetic-field-distribution tuner, according to one more different embodiment of the present disclosure.

In one embodiment of the present disclosure as shown in FIG. 7, the MFD tuner 100 and/or the reaction chamber 11 may further include a back plate 113. The back plate 113 includes a first surface 1131 and a second surface 1133, wherein the first surface 1131 is connected to the second surface 153 of the target material 15, the second surface 1133 is disposed with the shield unit 19. Moreover, the second surface 1133 of the back plate 113 may be formed with at least one cavity 14, for holding and positioning the shield unit 19 therein. Surely, in an embodiment omitting the back plate 113, the second surface 153 of the target material 15 may as well, formed with at least one cavity for holding the shield unit 19.

Figure 8:
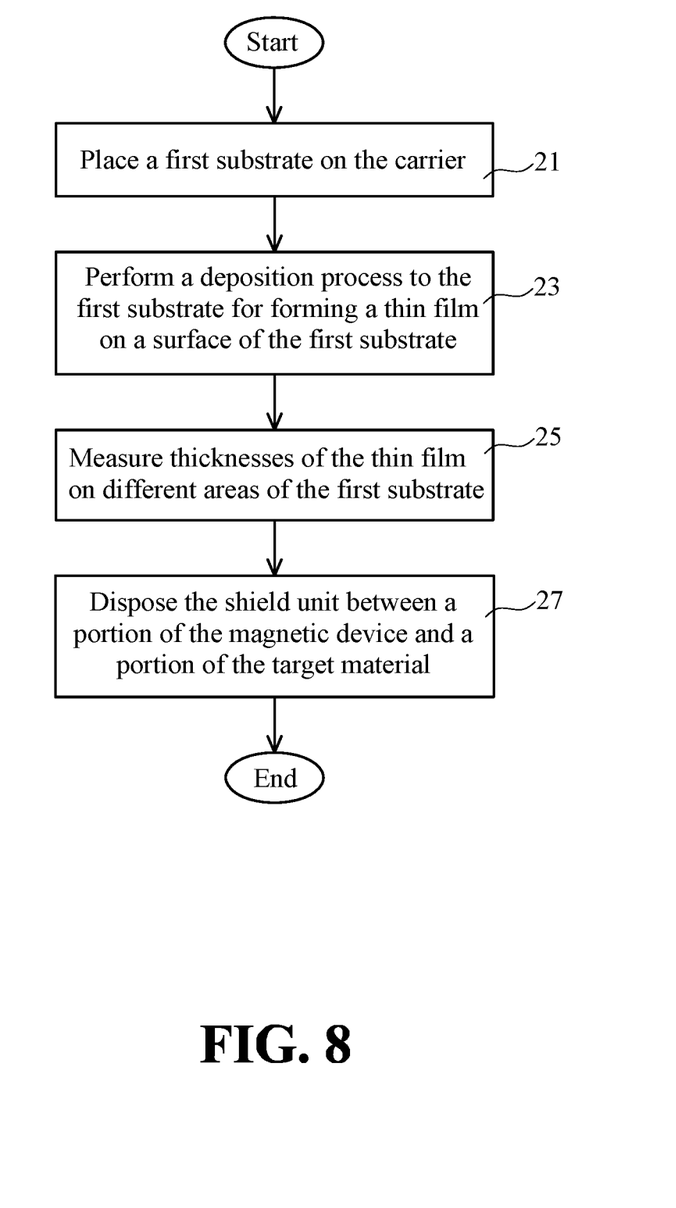
FIG. 8 is a flowchart of a deposition method according to one more different embodiment of the present disclosure.

Referring to FIG. 8, which is a flowchart of a deposition method according to one more different embodiment of the present disclosure. Along with a reference to FIG. 1 and FIG. 2, the deposition method starts with a step 21, which is to place a first substrate 133 (e.g. test substrate) on the carrier 13 of the deposition equipment 10. Specifically, the step 21 can be proceeded by employing a robotic arm to bring the first substrate 133 into a substrate passage (not shown) of the reaction chamber 11, and then to place the first substrate 133 on the carrier 13, thereafter, the carrier 13 carries the first substrate 133 to approach the blocking member 111 and the target material 15, then to form the reacting space 121 with the blocking member 111 within the reaction chamber 11.

The next step 23 is to perform a deposition process to the first substrate 133 by the deposition equipment 10, to form a thin film on surface the first substrate 133. Specifically, the step 23 may be proceeded by applying an electric field to a process disposed within the reacting space 121, to electrify, ionize atoms or molecules of the process gas and hence to form ionized gas. Thereafter, to apply a bias electricity on the target material 15 and the carrier 13, such that to attract the ionized gas to bombard the target material 15 for creating splashed particles therefrom, and then the splashed particles are attracted by the bias electricity on the carrier 13 and hence deposited on the first substrate 133 to form the thin film thereon.

The next step 25 is to measure thickness of the thin film, which is formed on the first substrate 133. Specifically, the step 25 may be proceeded in a manner to measure thicknesses of the thin film on different areas of the first substrate 133, such that estimate a uniformity of the thin film.

Figure 9:
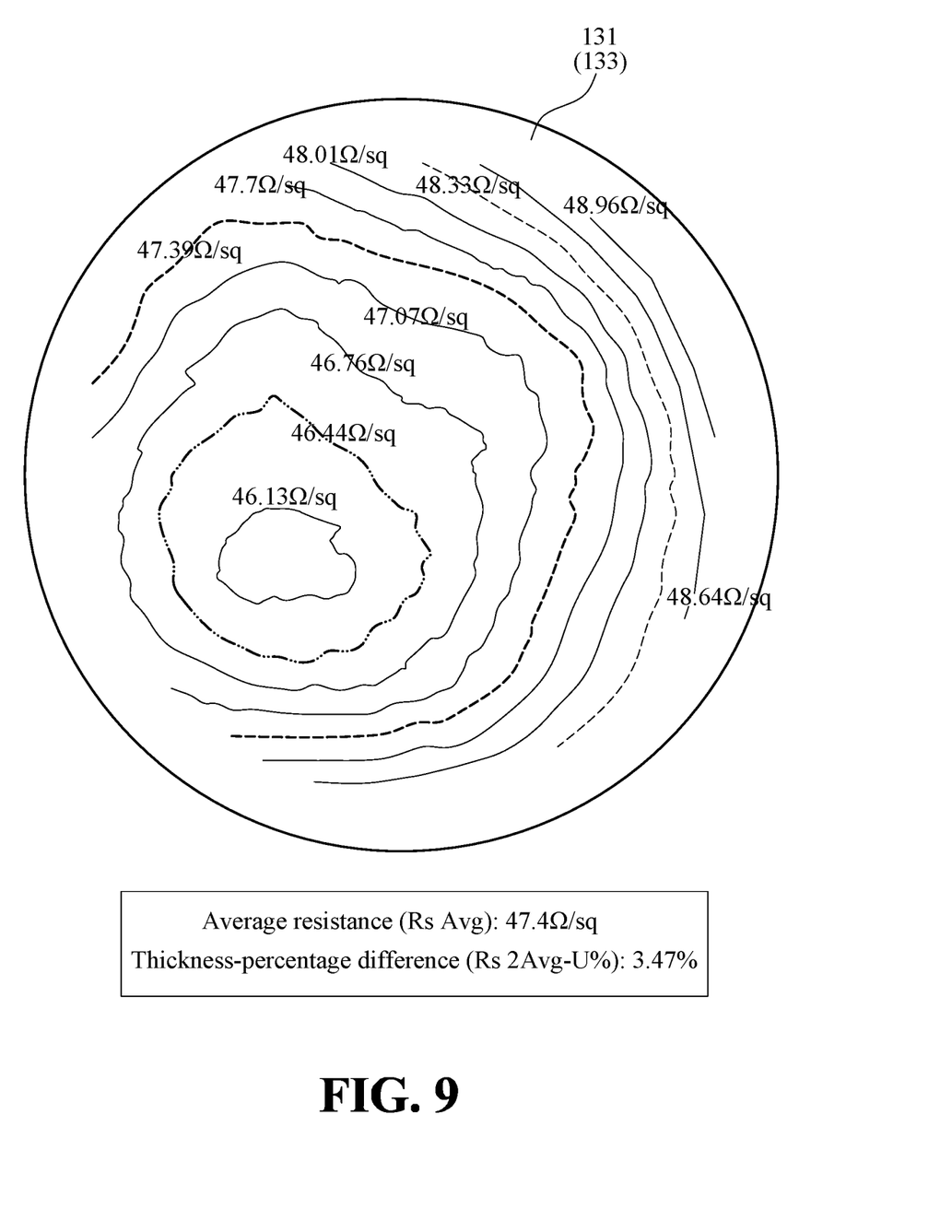
FIG. 9 is a resistance mapping corresponding to thicknesses of a thin film on different areas of a substrate which is formed by a conventional deposition equipment.

Referring to FIG. 9, which is a resistance mapping corresponding to thicknesses of a thin film on different areas of a substrate which is formed by a conventional deposition equipment. The step 25 proceeded by the deposition equipment 10 according to the present disclosure, which may have a result similar to that of FIG. 9, wherein an average resistance (Rs Avg) measured from a thin film on a conventional substrate 131 or the thin film on the first substrate 133 is proximately 47.4 ohm per square ($\Omega$/sq), and a thickness-percentage difference (Rs 2Avg-U %) of the thin film is proximately 3.47%.

On next, the step 27 is to place, arrange the shield unit 19 between a portion of the magnetic device 17 and a portion of the target material 15 in accordance with the resistance corresponding to different thicknesses as shown in FIG. 9, such that the shield unit 19 partially, locally blocks the magnetic field generated by the magnetic device 17, therefore to have a portion of the magnetic field below the shield unit 19 weakened.

In practical use, the substrate 131 may be partitioned into different areas, and the target material 15 may also be partitioned into different areas corresponding to the areas of the substrate 131. Based on the thicknesses measured on each of areas of the substrate 131, then to arrange the shield unit 19 on a corresponding area of the target material 15, in order to control the thickness of thin film on different areas of the substrate 131.

In one embodiment of the present disclosure, for the thin film formed on the first substrate 133, which may have different thicknesses on different areas of the first substrate 133, and those areas can be more specifically partitioned into such as first-thickness areas and second-thickness areas, wherein the thicknesses on the first-thickness areas are thicker than the thicknesses on the second-thickness areas. According thereto, the method may further include a step of placing and arranging one or more shield unit 19 between the magnetic device 17 and the target material 15, corresponding to the first-thickness areas and/or the thicknesses thereon, such that to block, weaken corresponding portions of the magnetic field corresponding to the first area. For example, the shield unit 19 may be disposed on the target material 15 and right above the first-thickness area.

After accomplishing all of the steps 21~27, then to place a second substrate 135 on the carrier 13, and then to proceed another deposition process to the second substrate 135.

Figure 10:
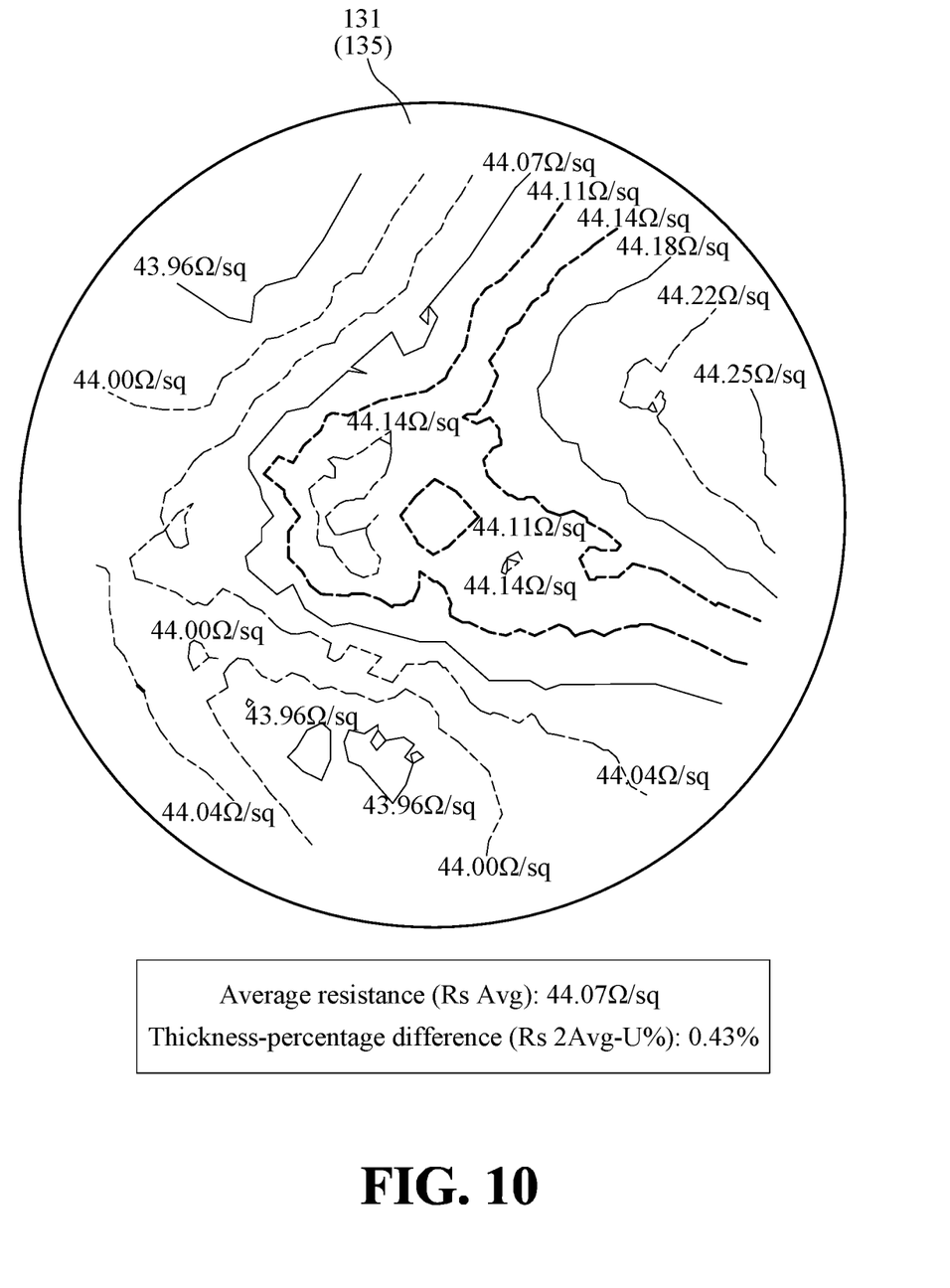
FIG. 10 is a resistance mapping corresponding to thicknesses of a thin film on different areas of a substrate which is formed by the deposition equipment, according to one embodiment of the present disclosure.

Referring to FIG. 10, which is a resistance mapping corresponding to thicknesses of a thin film on different areas of a substrate which is formed by the deposition equipment, according to one embodiment of the present disclosure. As shown in the FIG., an average resistance (Rs Avg) of a thin film formed on the second substrate 135 is proximately 44.07 $\Omega$/sq, and the thickness-percentage difference of the thin film is proximately 0.43%. As shown in FIG. 9 and FIG. 10, it is apparent that the deposition equipment 10 and the deposition method according the present disclosure can effectively improve the uniformity, evenness of thin film formed on the second substrate 135, based on the result of the first substrate 133.

Figure 11:
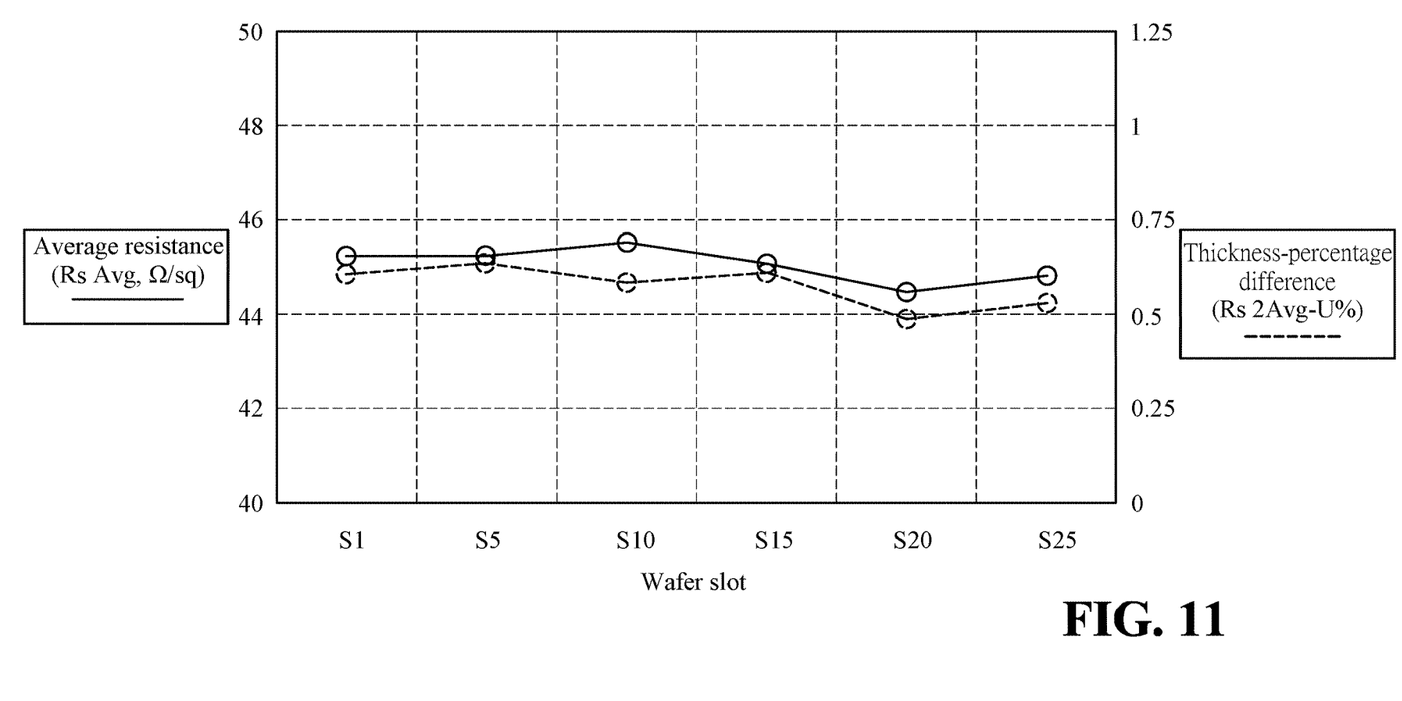
FIG. 11 is a line chart illustrating a relationship between a resistance and a thickness-percentage difference of thin film formed on different substrates by the deposition equipment, according to one embodiment of the present disclosure.

Referring to FIG. 11, which is a line chart illustrating a relationship between a resistance and a thickness-percentage difference of thin film formed on different substrates by the deposition equipment 10, according to one embodiment of the present disclosure. As shown in the FIG., the deposition equipment 10 with a partially adjusted, tuned magnetic field, which can maintain a certain quality of deposition process proceeded to the second substrate 135 and the later-processed substrates S1~S25, with the average resistance in a range of 44 Ω/sq~46 Ω/sq, also the thickness-percentage difference of thin film all less than 1%. Thereby, the deposition method according the present disclosure is also proven to be effective for repeat production.

Figure 12:
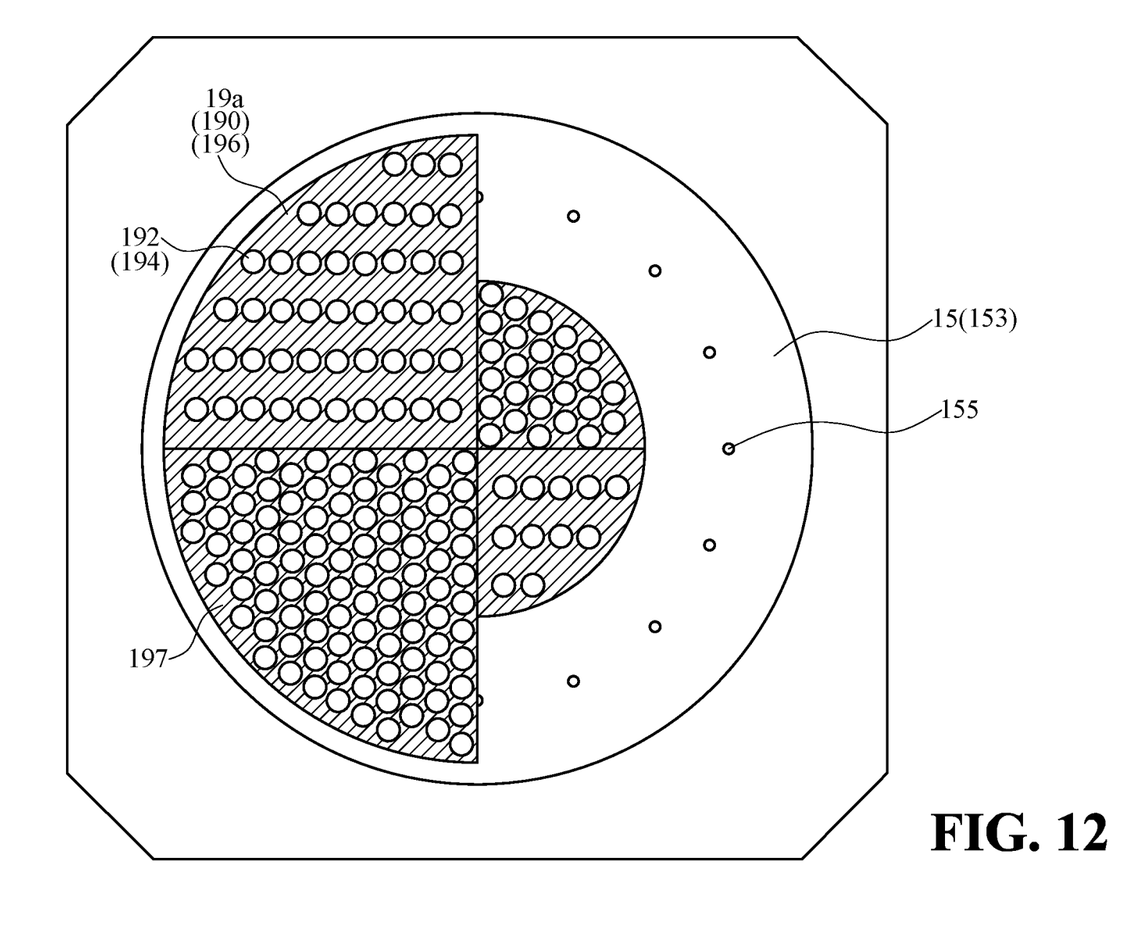
FIG. 12 is a schematic top view illustrating the target material and the shield unit of the magnetic-field-distribution tuner, according to another embodiment of the present disclosure.

Referring to FIG. 12, which is a schematic top view illustrating the target material 15 and the shield unit 19a of the MFD tuner 100a, according to another embodiment of the present disclosure. In this embodiment, the shield unit 19a is configured to have a main portion 190 formed with at least one shield hole 192 and/or at least one shield cavity 194 (all plural in this embodiment but not limited thereto), wherein the main portion 190 itself and shield hole 192 and/or the shield cavity 194 all have different blocking effect against the magnetic field of the magnetic device 170. Therefore, by virtue of the shield hole 192 and/or the shield cavity 194, the shield unit 19 may further micro-adjust the magnetic field generated by the magnetic device 17, in a more precise manner.

To be specific, the main portion 190 of the shield unit 19a can block, weaken the magnetic field within the containing space 12, whereas the shield hole 192 which extends through two opposite surfaces of the main portion 190 (e.g. upper surface and lower surface) and which hence allow the magnetic field to pass. In the other hand, the shield cavity 194 does not extend through but only concaves into the main portion 190, with a thickness less than that of the main portion 190. With such structure, the main portion 190 has a greater blocking effect against the magnetic field than that of the shield cavity 194. Thus, by virtue of the main portion 190 with the shield cavity 194 and/or the shield hole 192, the shield unit 19a can provide more different blocking effects against the magnetic field.

In practical use, the shield unit 19a may be rearranged at different locations or formed with a different area size, also the shield hole 192 may be plural distributed in a different population or formed in different sizes, and the shield cavity 194 may also be plural distributed in a different population or formed in different sizes or even different depths, in order to precisely adjust, tune the magnetic field generated by the magnetic device 17.

Similar to the aforementioned embodiments of FIG. 4~FIG. 6, the shield unit 19a and the target material 15 in this embodiment may also be configured to connect to each other by the shield pins 191 and the pin holes 155, or even with the connectors 195 to fasten the shield pins 191 and the pin holes 155. Also similar to the aforementioned embodiments of FIG. 7, the shield unit 19a may be disposed within the cavity 14 of the back plate 113. Surely, the shield unit 19a may also be formed with different size and shape.

Furthermore, the deposition equipment 10a in this embodiment is also adapted to the deposition method as shown in FIG. 8, wherein the step 27 has a different manner to arrange the shield unit 19a. As shown in FIG. 12, the shield unit 19a becomes two as a first-shield unit 196 and a second-shield unit 197. For the aforementioned first-thickness areas with greater thicknesses of thin film and the second-thickness area with less thicknesses of thin film on the first substrate 133, the step is to dispose the first-shield unit 196 between the magnetic device 17 and the target material 15 corresponding to the first-thickness area and/or the thicknesses thereon, for partially blocking the magnetic field corresponding thereto. In the other hand, to dispose the second-shield unit 197 between the magnetic device 17 and the target material 15 corresponding to the second-thickness area and/or the thicknesses thereon, for partially blocking the magnetic field corresponding thereto. In more detail, the shield holes 192 and/or the shield cavities 194 on the first-shield unit 196 are formed to distribute in a population or formed in sizes, which are less than a population or sizes of the shield holes 192 and/or the shield cavities 194 on the second-shield unit 197, such that the first-shield unit 196 performs a better blocking effect than that of the second-shield unit 197 against the magnetic field.

Figure 13:
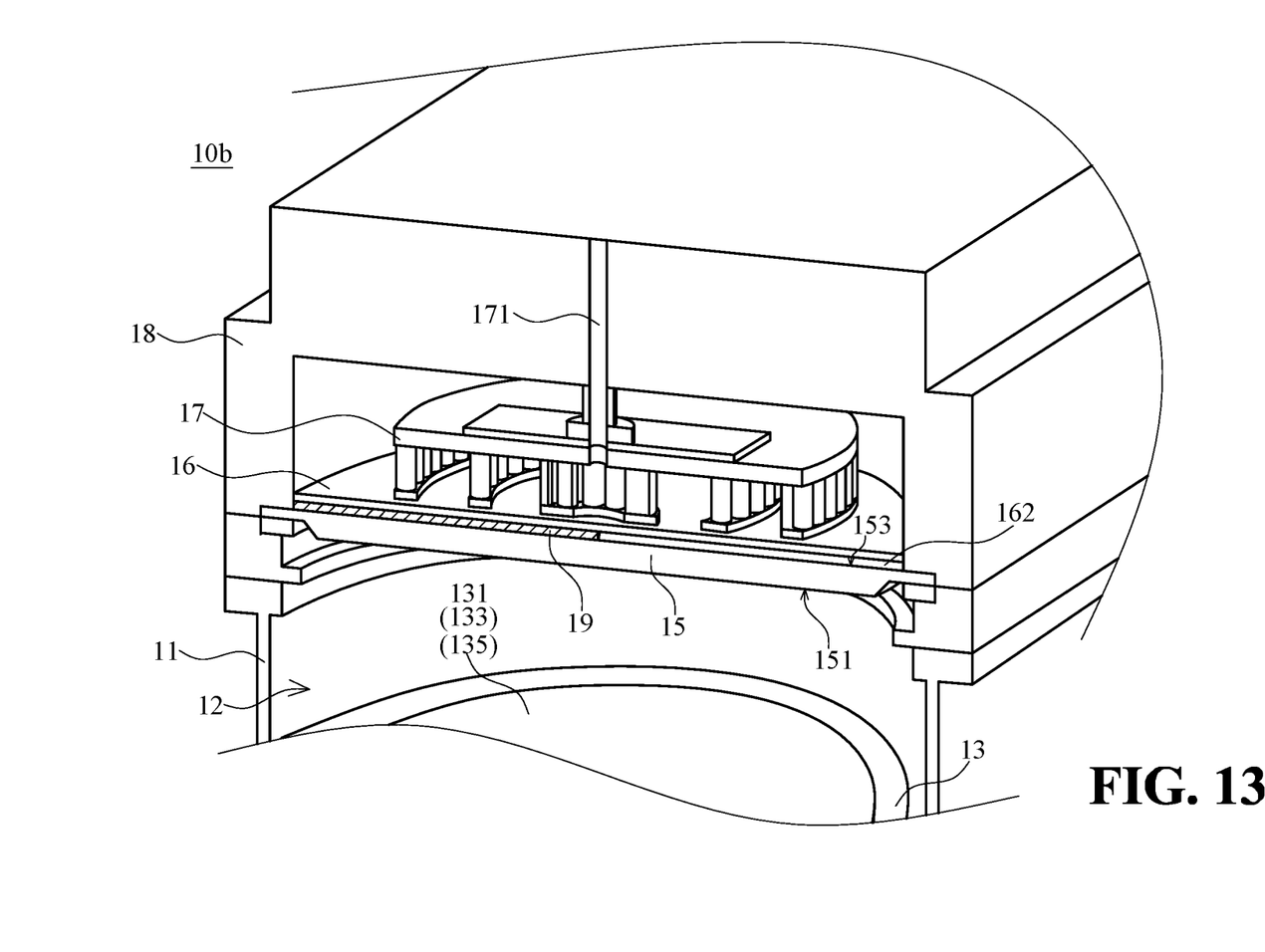
FIG. 13 is a schematic perspective sectional view illustrating the magnetic-field-distribution tuner, according to yet another embodiment of the present disclosure.

Referring to FIG. 13, which is a schematic perspective sectional view illustrating the MFD tuner 100b, according to yet another embodiment of the present disclosure. The deposition equipment 10b in this embodiment further includes at least one lock unit 16 disposed at side of the second surface 153 of the target material 15, wherein the lock unit 16 is positioned between the magnetic device 17 and the target material 15 and formed with at least one mounting space 162. Specifically, the lock unit 16 is made of electrical insulator that has no effect to the magnetic field of the magnetic device 17.

The lock unit 16 and the second surface 153 of the target material 15 have a mounting space 162 therebetween, the shield units 19, 19a may be disposed within the mounting space 162 for partially, locally blocking the magnetic field.

The lock unit 16 can facilitate locking and holding one or more shield units 19, 19a between a portion of the target material 15 and a portion of the magnetic device 17, for partially, locally blocking the magnetic field. Moreover, with such structure, the shield units 19, 19a can be easily extracted out of the mounting space 162 or simply rearranged within the mounting space 162, in order to facilitate the blocking effect against the magnetic field.

In one embodiment of the present disclosure, the lock unit 16 may be a plate disposed within the mounting chamber 18 along with the magnetic device 17 and the shield units 19, 19a, as shown in FIG. 13, such as to be fastened on an inner surface of the mounting chamber 18, and thereby to form the mounting space 162 with the target material 15. In a different embodiment, the lock unit 16 may be directly disposed or fastened on the second surface 153 of the target material 15, however still maintain the mounting space 162 therebetween for containing and locking the shield units 19, 19a.

Figure 14:
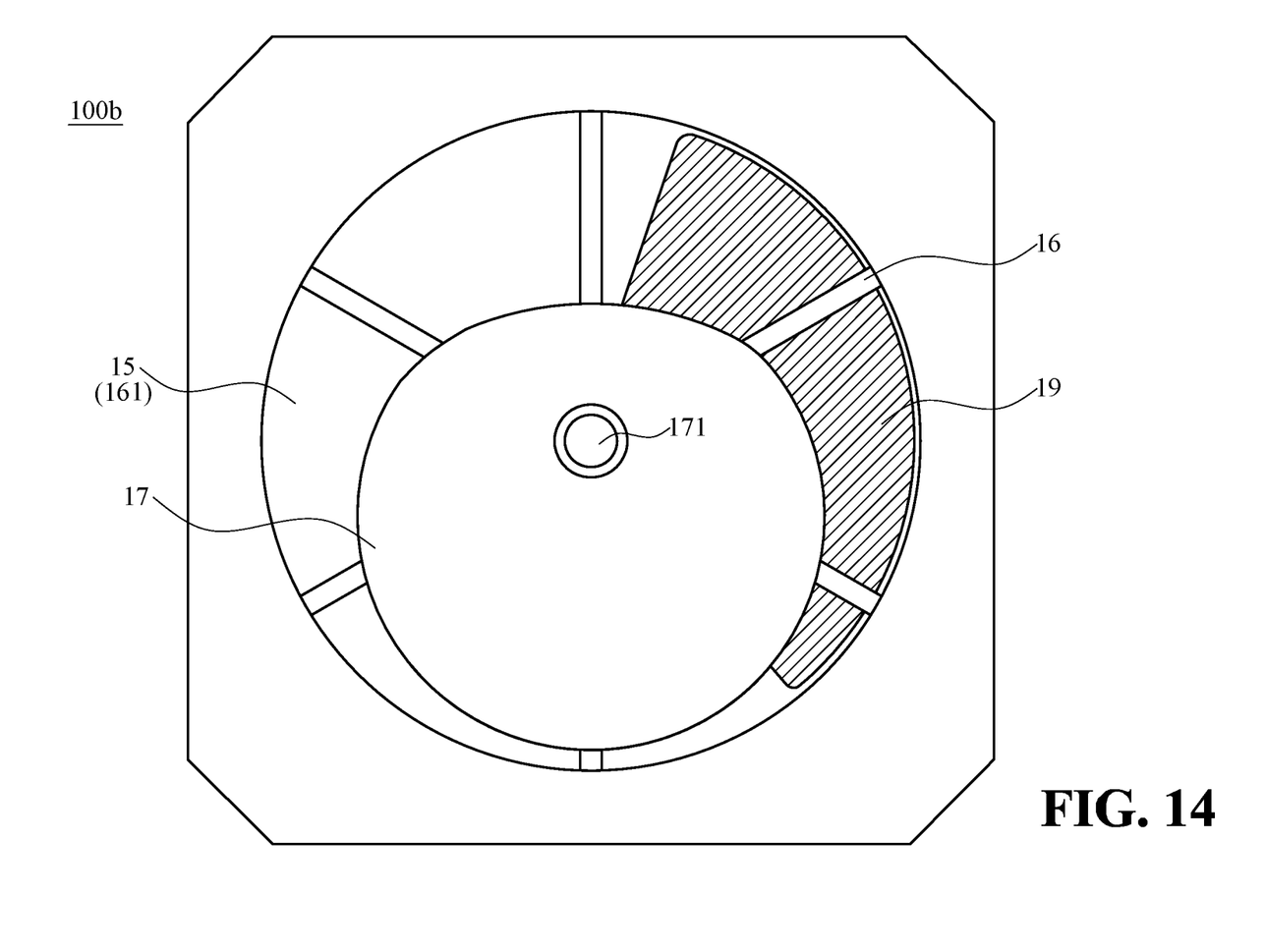
FIG. 14 is a schematic top view illustrating the magnetic-field-distribution tuner, according to yet another different embodiment of the present disclosure.

In another different embodiment of the present disclosure as shown in FIG. 14, the lock unit 16 may be a frame, wherein the lock unit 16 includes a plurality of hollow portions 161. The lock unit 16 and the target material 15 form the mounting space 162 therebetween, and the shield unit 19 is disposed within the mounting space 162.

Similar to the aforementioned embodiments of FIG. 4~FIG. 6, the shield units 19, 19a may be plural disposed and locked in any possible manner within the lock unit 16. Surely, the shield unit 19, 19a may also be formed with different size or shape, and be arranged in any possible manner on the second surface 153 of the target material 15.

As shown in FIG. 7, the MFD tuner 100b and/or the reaction chamber 11 may also include a back plate 113, the lock unit 16 and/or the shield units 19, 19a directly or indirectly disposed on the second surface 1133 of the back plate 113. Furthermore, the second surface 1133 of the back plate 113 or the second surface 153 of the target material 15 may be formed with cavity for positioning the shield units 19, 19*a*, with the lock unit 16 covering the cavity and the shield units 19, 19*a*.

Moreover, the deposition equipment 10*b* and the MFD tuner 100*b* are also adapted to the deposition method as shown in FIG. 8, wherein in the step 27 may be proceeded in accordance with the thicknesses of thin film formed on different areas the first substrate 133, then to place the shield units 19, 19*a* between a portion of the magnetic device 17 and a portion of the target material 15 and within the mounting space 162 of the lock unit 16, such that to partially, locally block the magnetic field of the magnetic device 17.

The above disclosure is only the preferred embodiment of the present disclosure, and not used for limiting the scope of the present disclosure. All equivalent variations and modifications on the basis of shapes, structures, features and spirits described in claims of the present disclosure should be included in the claims of the present disclosure.

I claim:

1. A deposition method for tuning magnetic field distribution of a deposition equipment, wherein the deposition equipment comprises a carrier, a target material, a magnetic device and a plurality of shield units, and the target material faces the carrier and is located between the carrier and the magnetic device, comprising:
    placing a first substrate on the carrier;
    performing a deposition process to the first substrate for forming a thin film on a surface of the first substrate;
    measuring thicknesses of the thin film on a plurality of areas of the first substrate;
    partitioning the target material into a plurality of areas according to the plurality of areas of the first substrate;
    arranging the plurality of shield units on part of areas of the target material according to the thicknesses of thin film on the areas of the first substrate, to partially blocking a magnetic field of the magnetic device by the plurality of shield units, wherein each of the shield units is made of an electrical conductor;
    inserting a plurality of shield pins of the plurality of shield units into a plurality of pin holes of the target material, wherein the plurality of shield pins are located on the plurality of shield units and the plurality of pin holes are located on the target material;
    partitioning the plurality of areas of the first substrate into a first-thickness area and a second-thickness area in accordance with the thicknesses of the thin film on the first substrate, wherein thicknesses of the thin film on the first-thickness area are thicker than that on the second-thickness area;
    partitioning the plurality of shield units as a first-shield unit and a second-shield unit, wherein both the first-shield unit and the second-shield unit comprise a plurality of shield holes, and total area or arrangement density of the shield holes of the first-shield unit is smaller than that of the second-shield unit;
    disposing the first-shield unit between the magnetic device and the target material in accordance with the first-thickness area, and disposing the second-shield unit between the magnetic device and the target material in accordance with the second-thickness area; and
    placing a second substrate on the carrier and performing the deposition process to the second substrate.

2. A deposition method for tuning magnetic field distribution of a deposition equipment, wherein the deposition equipment comprises a carrier, a target material, a magnetic device and a plurality of shield units, and the target material faces the carrier and is located between the carrier and the magnetic device, comprising:
    placing a first substrate on the carrier performing a deposition process to the first substrate for forming a thin film on a surface of the first substrate;
    measuring thicknesses of the thin film on a plurality of areas of the first substrate;
    partitioning the target material into a plurality of areas according to the plurality of areas of the first substrate;
    arranging the plurality of shield units on part of areas of the target material according to the thicknesses of thin film on the areas of the first substrate, to partially blocking a magnetic field of the magnetic device by the plurality of shield units, wherein each of the shield units is made of an electrical conductor;
    inserting a plurality of shield pins of the plurality of shield units into a plurality of pin holes of the target material, wherein the plurality of shield pins are located on the plurality of shield units and the plurality of pin holes are located on the target material;
    partitioning the plurality of areas of the first substrate into a first-thickness area and a second-thickness area in accordance with the thicknesses of the thin film on the first substrate, wherein thicknesses of the thin film on the first-thickness area are thicker than that on the second-thickness area;
    partitioning the plurality of shield units as a first-shield unit and a second-shield unit, wherein both the first-shield unit and the second-shield unit comprise a plurality of shield cavities, and total area or arrangement density of the shield cavities of the first-shield unit is smaller than that of the second-shield unit;
    disposing the first-shield unit between the magnetic device and the target material in accordance with the first-thickness area, and disposing the second-shield unit between the magnetic device and the target material in accordance with the second-thickness area; and
    placing a second substrate on the carrier and performing the deposition process to the second substrate.

3. The deposition method according to claim 1, further comprising:
    aligning a plurality of through holes of the shield unit to a plurality of pin holes of the target material in accordance with the thicknesses of the thin film on the plurality of areas of the first substrate, wherein the through holes are located on the plurality of shield units and the pin holes are located on the target material; and
    inserting a plurality connectors into the through holes and connecting to the pin holes to fasten the shield unit and the target material.

4. The deposition method according to claim 1, further comprising: disposing the plurality of shield units in a mounting space of a lock unit in accordance with the thicknesses of the thin film on the plurality of areas of the first substrate, wherein the lock unit is disposed on the target material to form the mounting space between the target material and the lock unit.

* * * * *